United States Patent
Daubenspeck et al.

(10) Patent No.: US 8,299,581 B2
(45) Date of Patent: Oct. 30, 2012

(54) PASSIVATION LAYER EXTENSION TO CHIP EDGE

(75) Inventors: Timothy H. Daubenspeck, Colchester, VT (US); Ekta Misra, Fishkill, NY (US); Marie-Claude Paquet, Bromont, CA (US); Francis Santerre, Chambly, CA (US); Wolfgang Sauter, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 12/796,068

(22) Filed: Jun. 8, 2010

(65) Prior Publication Data

US 2011/0298095 A1    Dec. 8, 2011

(51) Int. Cl.
*H01L 23/544*    (2006.01)

(52) U.S. Cl. . 257/620; 257/622; 257/626; 257/E21.041; 438/114; 438/465

(58) Field of Classification Search .................. None
See application file for complete search history.

(56) References Cited

U.S. PATENT DOCUMENTS

| | | | |
|---|---|---|---|
| 5,151,389 | A | 9/1992 | Zappella |
| 5,434,106 | A | 7/1995 | Lim et al. |
| 6,399,463 | B1 | 6/2002 | Glenn et al. |
| 6,656,758 | B1 * | 12/2003 | Shinogi et al. ............ 438/33 |
| 7,129,114 | B2 | 10/2006 | Akram |
| 7,473,997 | B2 | 1/2009 | Srivastava et al. |
| 7,514,291 | B2 | 4/2009 | Akram |
| 2009/0243098 | A1 | 10/2009 | Farooq et al. |
| 2009/0256257 | A1 | 10/2009 | Daubenspeck et al. |
| 2010/0200960 | A1 * | 8/2010 | Angyal et al. ............ 257/620 |
| 2011/0140245 | A1 * | 6/2011 | Lane et al. .............. 257/620 |

* cited by examiner

*Primary Examiner* — Evan Pert
*Assistant Examiner* — Scott R Wilson
(74) *Attorney, Agent, or Firm* — David A. Cain; Hoffman Warnick LLC

(57) ABSTRACT

Embodiments of the invention provide a semiconductor chip having a passivation layer extending along a surface of a semiconductor substrate to an edge of the semiconductor substrate, and methods for their formation. One aspect of the invention provides a semiconductor chip comprising: a semiconductor substrate; a passivation layer including a photosensitive polyimide disposed along a surface of the semiconductor substrate and extending to at least one edge of the semiconductor substrate; and a channel extending through the passivation layer to the surface of the semiconductor substrate.

18 Claims, 5 Drawing Sheets

PASSIVATION LAYER EXTENSION TO CHIP EDGE

BACKGROUND

Adhesion of an underfill to a semiconductor chip surface is critical to the reliability of the finished module, particularly in the presence of thermal cycling stresses. A lack of adhesion or weak adhesion will result in delamination and, as a consequence, electrical failures due to cracking in chip-side electrical components, such as solder bump structures and aluminum contacts. Once delamination and cracking begins, it is difficult or impossible to stop, since the force underlying such cracking increases as the length of the crack increases. This problem increases with increasing chip size.

SUMMARY

Embodiments of the invention provide a semiconductor chip having a passivation layer extending along a surface of a semiconductor substrate to an edge of the semiconductor substrate, and methods for their formation.

One aspect of the invention provides a semiconductor chip comprising: a semiconductor substrate; a passivation layer including a photosensitive polyimide disposed along a surface of the semiconductor substrate and extending to at least one edge of the semiconductor substrate; and a channel extending through the passivation layer to the surface of the semiconductor substrate.

Another aspect of the invention provides a method of forming a semiconductor chip, the method comprising: depositing a passivation material onto a surface of a semiconductor substrate to form a passivation layer extending to an edge of the semiconductor substrate; and etching a channel into the passivation layer through to the surface of the semiconductor substrate to leave a peripheral portion of the passivation layer adjacent the edge of the semiconductor substrate.

Yet another aspect of the invention provides a method of forming a passivation layer on a semiconductor substrate, the method comprising: depositing a photosensitive polyimide onto a surface of a semiconductor substrate to form a passivation layer extending to an edge of the semiconductor substrate; photolithographically patterning and etching a channel into the passivation layer through to the surface of the semiconductor substrate to leave a peripheral portion of the passivation layer adjacent the edge of the semiconductor substrate; laser dicing the edge of the semiconductor substrate through the passivation layer; and blade dicing the edge of the semiconductor substrate through the passivation layer.

The illustrative aspects of the present invention are designed to solve the problems herein described and other problems not discussed, which are discoverable by a skilled artisan.

BRIEF DESCRIPTION OF THE SEVERAL VIEWS OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
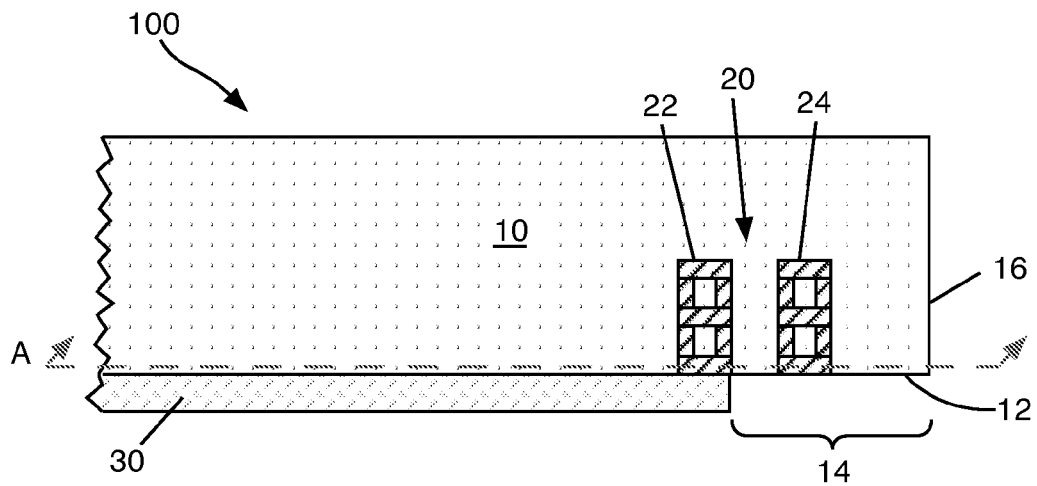
FIGS. 1-2 show cross-sectional views of a semiconductor chip with a passivation layer not extending fully to the dicing edge of the semiconductor chip.

FIG. 1 shows a partial cross-sectional side view of a semiconductor chip 100 comprising a semiconductor substrate 10 and a passivation layer 30. Substrate 10 includes a crackstop structure 20 near an edge 16 of substrate 10, the crackstop structure 20 having a first crackstop pillar 22 and a second crackstop pillar 24. In such an arrangement a gap 14 exists between passivation layer 30 and edge 16 of substrate 10, such that a surface 12 of substrate 10 is exposed.

Underfill materials have been shown to adhere better to materials used in passivation layer 30 than to the hard dielectric nitride and oxide materials typical of substrate 10. Substrate 10 may include, for example, silicon (Si), silicon oxide ($SiO_2$), silicon nitride ($Si_3N_4$), silicon oxynitride (SiON), hafnium silicate (HfSi), hafnium oxide ($HfO_2$), zirconium silicate ($ZrSiO_x$), zirconium oxide($ZrO_2$), and/or gallium arsenide (GaAs). Substrate 10 may include other materials, as will be apparent to one skilled in the art, and which are encompassed by the scope of the various embodiments of the invention. Surface 12, the most peripheral surface to which underfill materials may bond, provides a less adhesive surface than the material(s) of passivation layer 30. As such, delamination of an underfill material is more likely to occur along surface 12 than along passivation layer 30.

Passivation layer 30 may typically include any polyimide, photosensitive polyimide, or organic polymer film used in chip-level final passivation. Suitable materials include, for example, polybenzoxazole (PBO), benzocyclobutene (BCB), polyp-xylylene) polymers (such as parylene), and epoxy. Other materials will be apparent to one skilled in the art, and which are encompassed by the scope of the various embodiments of the invention.

First crackstop pillar 22 and second crackstop 24 of crackstop structure 20 may each, independently, include one or more materials commonly used in chip back end of line (BEOL) wiring and dielectric processing, such as metals and dielectrics. Suitable materials include, for example, aluminum (Al), copper (Cu), silicon (Si), polysilicon, silicon carbide (SiC), an oxide insulator, a nitride insulator, a low K dielectric material, and a refractory metal, such as tantalum (Ta), tantalum nitride (TaN), titanium tungsten (TiW), or titanium nitride (TiN).

Figure 2:
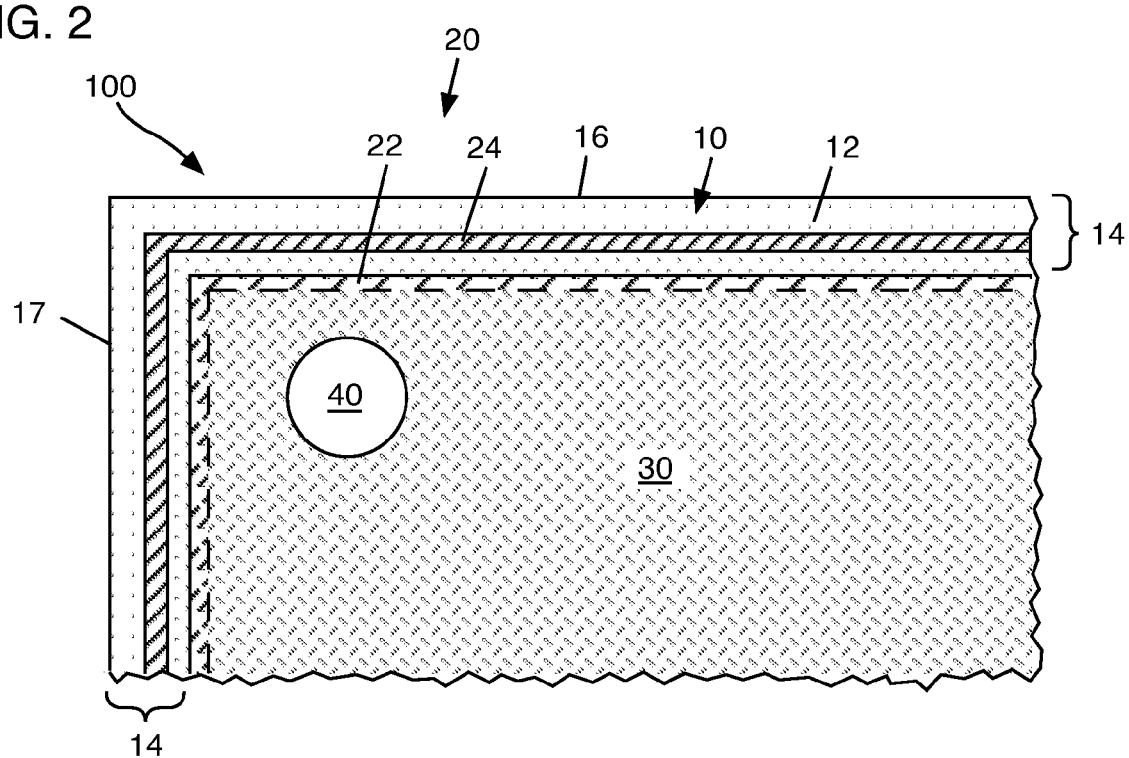

FIG. 2 shows a partial cross-sectional view of semiconductor chip 100 taken through plane A of FIG. 1. As can be seen in FIG. 2, gap 14 extends along edge 16 and adjacent edge 17. Second crackstop pillar 24 is exposed along surface 12 within gap 14. First crackstop pillar 22 (shown in phantom) is covered by passivation layer 30, as in FIG. 1. A solder bump structure 40 is shown adjacent edge 16 and edge 17. As noted above, delamination of an underfill along surface 12 may produce cracking in solder bump structure 40 and lead to electrical failures.

Figure 3:
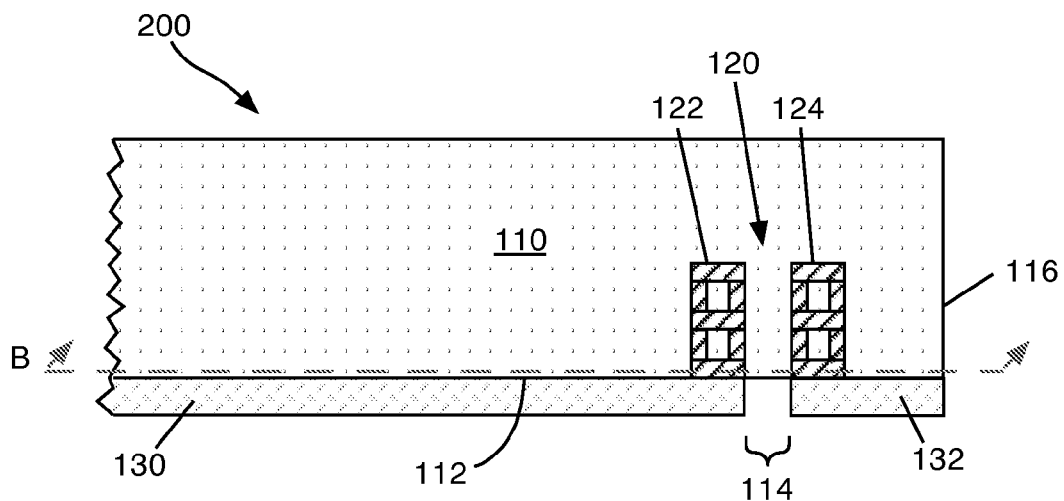
FIGS. 3-4 show cross-sectional views of a semiconductor chip according to an embodiment of the invention in which a portion of a passivation layer extends to an edge of the semiconductor chip.

FIG. 3 shows a partial cross-sectional side view of a semiconductor chip 200 according to one embodiment of the invention. Here, a passivation layer 130, including a photosensitive polyimide (PSPI) has been disposed along a surface 112 and etched to form a channel 114, leaving a peripheral portion 132 of passivation layer 130 adjacent an edge 116. Such an arrangement avoids the tendency of an underfill material to delaminate by providing a more adhesive material (i.e., PSPI in peripheral portion 132) nearest edge 116, where delamination most often occurs.

Any number of PSPIs with varying photosensitivity, mechanical, and adhesion properties may be employed in practicing aspects and embodiments of the invention. Suitable PSPIs will be recognized by one of ordinary skill in the art, including those available from Asahi Chemical, DuPont, and OCG.

Figure 4:
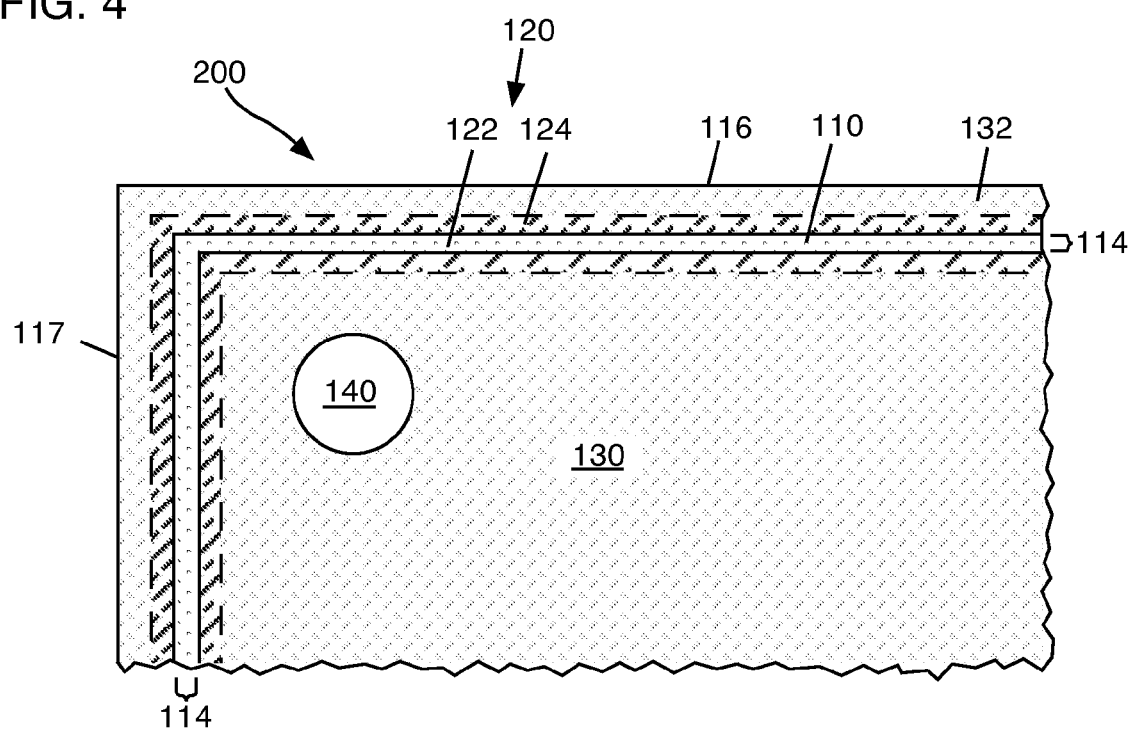

FIG. 4 shows a partial cross-sectional view of semiconductor chip 200 taken through plane B of FIG. 3. Peripheral portion 132 can be seen extending to edge 116 and an adjacent edge 117. Channel 114 lies between passivation layer 130 and peripheral portion 132. First crackstop pillar 122 and a second crackstop pillar 124, both shown in phantom, are covered by passivation layer 130 and peripheral portion 132, respectively. It should be noted that neither first crackstop pillar 122 nor second crackstop pillar 124 need necessarily be covered by passivation layer 130 or peripheral portion 132. Either or both crackstop pillars 122, 124 may be completely covered, partially covered, or exposed. The arrangement shown in FIGS. 3-4 is provided merely for the purpose of illustration. Other arrangements are shown and described below and still others will be apparent to one of skill in the art.

Figure 5:
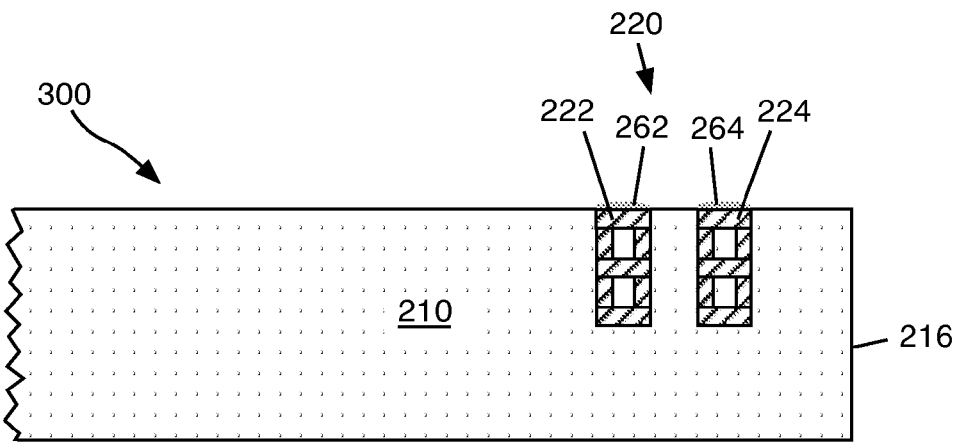
FIGS. 5-7 show side cross-sectional views of the formation of a semiconductor chip according to an embodiment of the invention.
Figure 6:
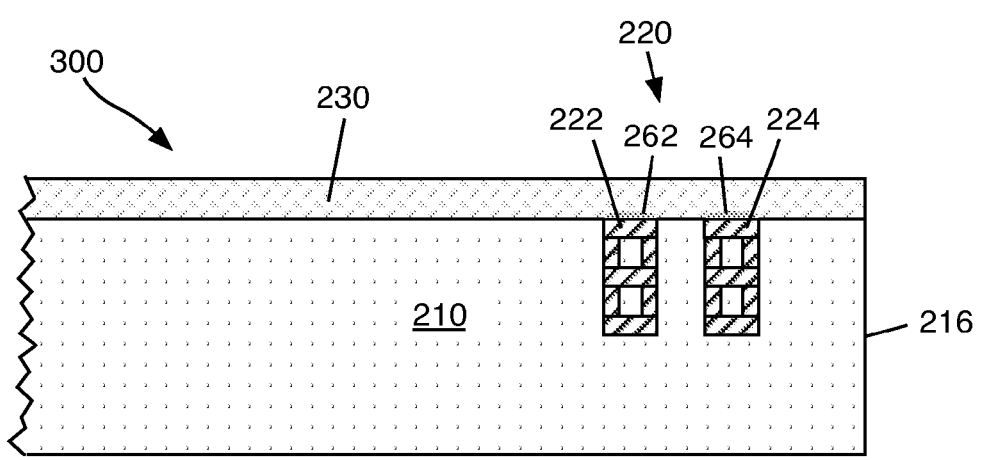
Figure 7:
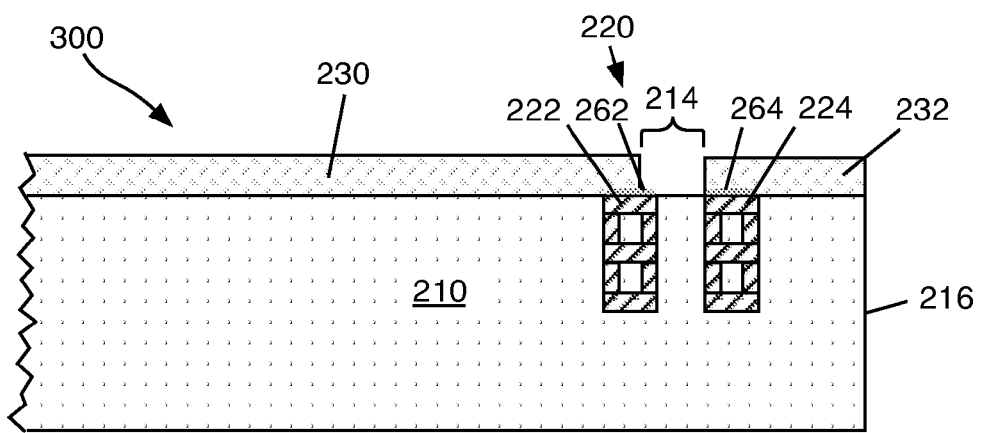

FIGS. 5-7 show partial cross-sectional side views of the formation of a semiconductor chip 300 according to another embodiment of the invention. For purposes of illustration and explanation, and to depict its orientation during formation, semiconductor chip 300 is shown inverted compared to the depictions in FIGS. 3-4.

FIG. 5 shows a crackstop structure 220 within a substrate 210. In the embodiment shown in FIG. 5, a thin cap 262, 264 has been applied to a crackstop structure 220 including a first crackstop pillar 222 and a second crackstop pillar 224, respectively. When employed, thin caps 262, 264 often comprise a thin layer of aluminum, although other materials may be employed.

In FIG. 6, a passivation layer 230 is deposited atop substrate 210, covering crackstop structure 220. In FIG. 7, channel 214 is formed in passivation layer 230, leaving a peripheral portion 232 adjacent edge 216. As noted above, in some embodiments of the invention, passivation layer 230 may include a PSPI. In such an embodiment, a channel 214 may be formed in passivation layer 230 by photolithographic patterning and etching.

Figure 8:
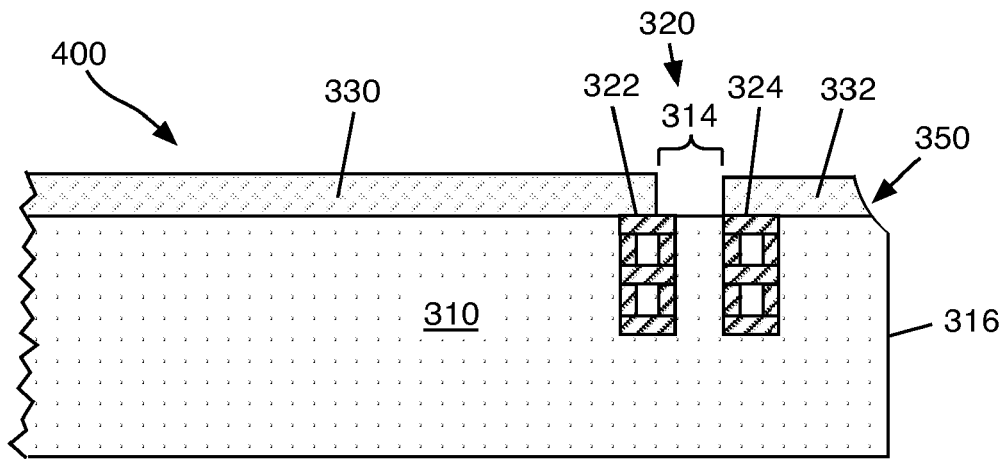
FIGS. 8-10 show side cross-sectional views of the dicing of an edge of semiconductor chips according to embodiments of the invention.
Figure 9:
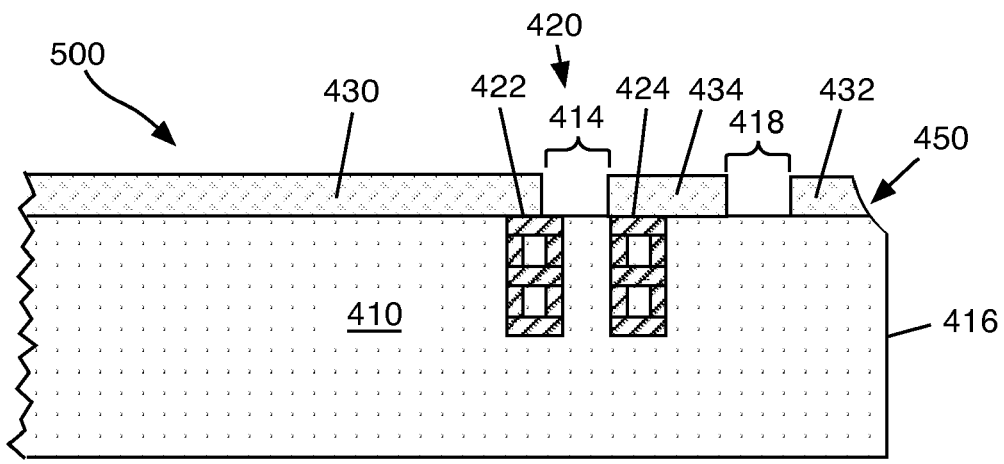
Figure 10:
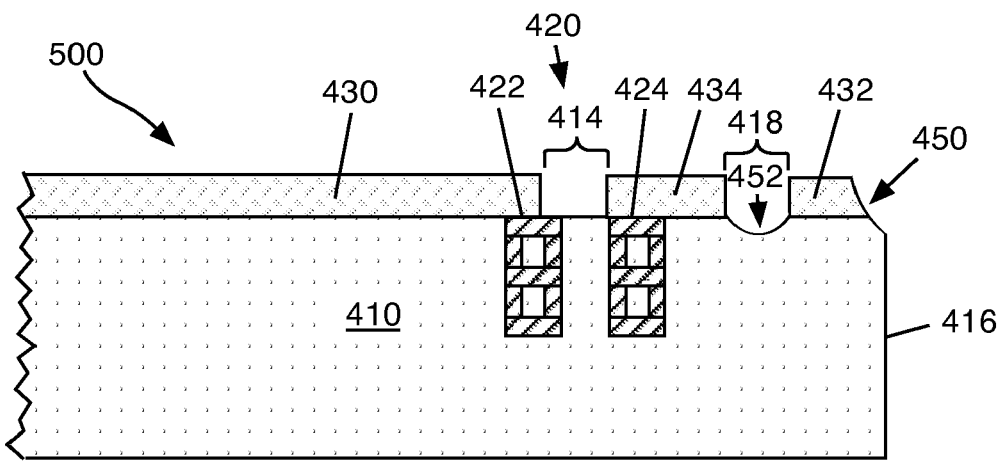

FIGS. 8-10 show the dicing of various semiconductor chips according to embodiments of the invention. In FIG. 8, an edge 316 of a semiconductor chip 400 is diced to form a diced edge 350. As can be seen, diced edge 350 extends through both a substrate 310 and a peripheral portion 332 of a passivation layer 330. The gumming of a mechanical blade by passivation layer 330 may be avoided by laser dicing followed by blade dicing.

FIGS. 9 and 10 show a semiconductor chip 500 according to an embodiment of the invention during a subsequent die singulation process. In FIG. 9, a cut 418 is made in a peripheral portion 432 between a second crackstop pillar 424 and an edge 416, thereby forming a middle portion 434 between a peripheral portion 432 and a passivation layer 430. In the embodiment of FIG. 10, cut 418 extends into substrate 410 to form a groove 452.

Figure 11:
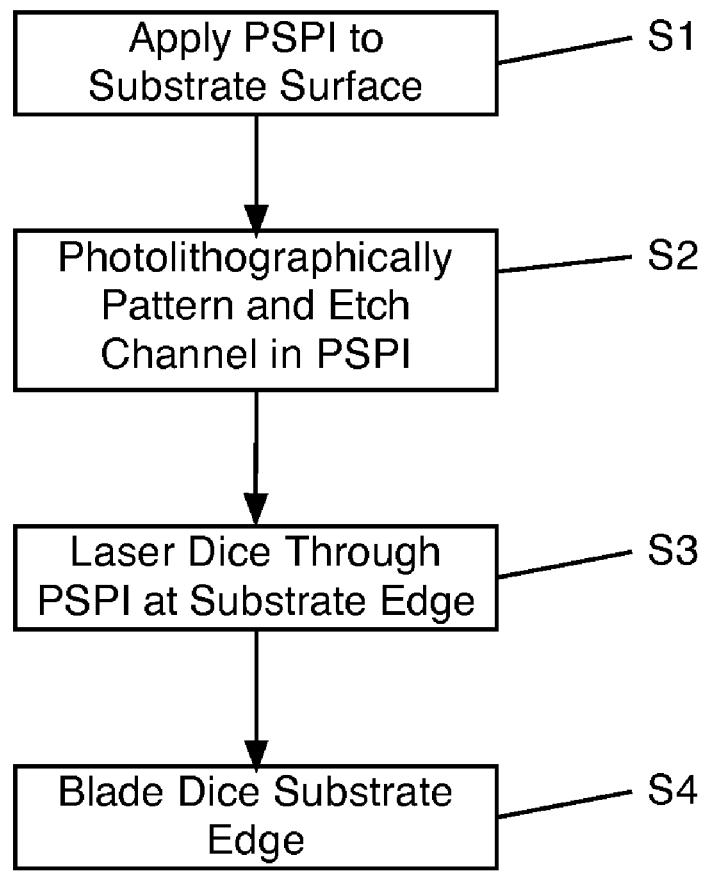
FIG. 11 shows a flow diagram of a method according to an embodiment of the invention.

FIG. 11 shows a flow diagram of a method according to an embodiment of the invention. At S1, a PSPI material (230 in FIG. 6) is deposited onto a substrate (210 in FIG. 6) surface. The PSPI may be deposited by any number of methods, including, for example, spin coating or spray deposition. At S2, a channel (214 in FIG. 7) is formed in the PSPI by photolithographic patterning and etching.

At S4, the semiconductor chip (400 in FIG. 8) may be laser diced through the PSPI (332 in FIG. 8) and substrate (310 in FIG. 8). At S5, the semiconductor chip (400) may be blade diced through the PSPI (332) and substrate (310) to form a diced edge (350 in FIG. 8).

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A semiconductor chip comprising:
    a semiconductor substrate;
    a passivation layer including a photosensitive polyimide disposed along a surface of the semiconductor substrate and extending to at least one edge of the semiconductor substrate; and
    a channel extending through the passivation layer to the surface of the semiconductor substrate,
    wherein the semiconductor substrate includes a crackstop structure extending from within the semiconductor substrate to the surface of the semiconductor substrate.

2. The semiconductor chip of claim 1, wherein the semiconductor substrate includes at least one material selected from a group consisting of: silicon (Si), silicon oxide ($SiO_2$), silicon nitride ($Si_3N_4$), silicon oxynitride (SiON), hafnium silicate (HfSi), hafnium oxide ($HfO_2$), zirconium silicate (Zr-$SiO_x$), zirconium oxide($ZrO_2$), and gallium arsenide (GaAs).

3. The semiconductor chip of claim 1, wherein the photosensitive polyimide is selected from a group consisting of: polybenzoxazole (PBO), benzocyclobutene (BCB), poly (p-xylylene) polymers, and epoxy.

4. The semiconductor chip of claim 1, wherein the channel is formed by photolithographic patterning and etching.

5. The semiconductor chip of claim 1, wherein the at least one edge of the semiconductor substrate includes a diced edge.

6. The semiconductor chip of claim 1, wherein the crackstop structure includes at least one material selected from a group consisting of: aluminum (Al), copper (Cu), silicon (Si), polysilicon, silicon carbide (SiC), an oxide insulator, a nitride insulator, a low K dielectric material, and a refractory metal.

7. The semiconductor chip of claim 1, further comprising:
    an additional channel extending through the passivation layer between the crackstop structure and the at least one edge of the semiconductor substrate.

8. The semiconductor chip of claim 7, wherein the crackstop structure includes:
    a first pillar disposed substantially parallel to the at least one edge; and a second pillar disposed substantially parallel to the at least one edge, wherein the second pillar is nearer the at least one edge than the first pillar and the additional channel lies between the second pillar and the at least one edge.

9. The semiconductor chip of claim 7, wherein the additional channel extends into the semiconductor substrate.

10. A method of forming a semiconductor chip, the method comprising:

depositing a passivation material onto a surface of a semiconductor substrate to form a passivation layer extending to an edge of the semiconductor substrate; and etching a channel into the passivation layer through to the surface of the semiconductor substrate to leave a peripheral portion of the passivation layer adjacent the edge of the semiconductor substrate, wherein the semiconductor substrate includes a crackstop structure and the peripheral portion of the passivation layer covers at least a portion of the crackstop structure.

11. The method of claim 10, wherein the passivation material includes a photosensitive polyimide and the etching includes photolithographic etching.

12. The method of claim 10, wherein the depositing includes spin coating.

13. The method of claim 10, wherein the crackstop structure includes:

a first pillar disposed parallel to the edge of the semiconductor substrate; and a second pillar disposed substantially parallel to the edge of the semiconductor substrate, wherein the second pillar is nearer the edge of the semiconductor substrate than the first pillar and the peripheral portion of the passivation layer covers at least a portion of the second pillar.

14. The method of claim 10, further comprising:

laser dicing the edge of the semiconductor substrate through the passivation layer.

15. The method of claim 14, further comprising:

blade dicing the edge of the semiconductor substrate through the passivation layer after the laser dicing.

16. A method of forming a passivation layer on a semiconductor substrate, the method comprising:

depositing a photosensitive polyimide onto a surface of a semiconductor substrate to form a passivation layer extending to an edge of the semiconductor substrate;

photolithographically patterning and etching a channel into the passivation layer through to the surface of the semiconductor substrate to leave a peripheral portion of the passivation layer adjacent the edge of the semiconductor substrate;

laser dicing the edge of the semiconductor substrate through the passivation layer; and blade dicing the edge of the semiconductor substrate through the passivation layer, wherein the semiconductor substrate includes a crackstop structure and the peripheral portion of the passivation layer covers at least a portion of the crackstop structure.

17. The method of claim 16, wherein the depositing includes spin coating.

18. The method of claim 16, wherein the crackstop structure includes:

a first pillar disposed parallel to the edge of the semiconductor substrate; and a second pillar disposed substantially parallel to the edge of the semiconductor substrate, wherein the second pillar is nearer the edge of the semiconductor substrate than the first pillar and the peripheral portion of the passivation layer covers at least a portion of the second pillar.

\* \* \* \* \*